(12) United States Patent
Kim et al.

(10) Patent No.: US 12,334,450 B2
(45) Date of Patent: Jun. 17, 2025

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Jin Seong Kim, Chandler, AZ (US); Yeong Beom Ko, Taichung (TW); Kwang Seok Oh, Incheon (KR); Jo Hyun Bae, Incheon (KR); Sung Woo Lim, Seoul (KR); Yun Ah Kim, Gyeonggi-do (KR); Yong Jae Ko, Gwangju (KR); Ji Chang Lee, Gwangju (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 18/391,075

(22) Filed: Dec. 20, 2023

(65) Prior Publication Data

US 2024/0194610 A1    Jun. 13, 2024

Related U.S. Application Data

(63) Continuation of application No. 17/510,528, filed on Oct. 26, 2021, now Pat. No. 11,854,991, which is a
(Continued)

(51) Int. Cl.
*H01L 21/78* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 21/4853; H01L 21/4857; H01L 21/565; H01L 21/568;
(Continued)

(56) References Cited

U.S. PATENT DOCUMENTS 7,622,325 B2    11/2009    Shim et al.
7,848,104 B2    12/2010    Shinohara
(Continued)

*Primary Examiner* — Vu A Vu
(74) *Attorney, Agent, or Firm* — Spectrum IP Law Firm LLC

(57) ABSTRACT

In one example, a semiconductor device comprises a main substrate having a top side and a bottom side, a first electronic component on the top side of the main substrate, a second electronic component on the bottom side of the main substrate, a substrate structure on the bottom side of the main substrate adjacent to the second electronic component, and an encapsulant structure comprising an encapsulant top portion on the top side of the main substrate and contacting a side of the first electronic component, and an encapsulant bottom portion on the bottom side of the main substrate and contacting a side of the second electronic component and a side of the substrate structure. Other examples and related methods are also disclosed herein.

13 Claims, 13 Drawing Sheets

Related U.S. Application Data continuation of application No. 16/703,240, filed on Dec. 4, 2019, now Pat. No. 11,158,582.

(51) Int. Cl.
  *H01L 21/56* (2006.01)
  *H01L 23/31* (2006.01)
  *H01L 23/538* (2006.01)

(52) U.S. Cl.
  CPC .......... *H01L 21/565* (2013.01); *H01L 21/568* (2013.01); *H01L 21/78* (2013.01); *H01L 23/3121* (2013.01); *H01L 23/5383* (2013.01); *H01L 23/5386* (2013.01)

(58) Field of Classification Search
  CPC . H01L 21/78; H01L 23/3121; H01L 23/5383; H01L 23/5386
  USPC ........................................................ 257/668
  See application file for complete search history.

(56) References Cited

U.S. PATENT DOCUMENTS

| | | | |
|---|---|---|---|
| 8,472,197 B2 | 6/2013 | Higashibata et al. | |
| 9,418,926 B1* | 8/2016 | Fay | H01L 24/81 |
| 9,711,492 B2 | 7/2017 | Albers et al. | |
| 9,837,288 B2 | 12/2017 | Basler et al. | |
| 10,026,671 B2* | 7/2018 | Yu | H01L 23/36 |
| 10,181,458 B2* | 1/2019 | Shih | H01L 25/50 |
| 10,468,384 B2* | 11/2019 | Yang | H01L 23/538 |
| 10,636,765 B2* | 4/2020 | Yang | H01L 25/0652 |
| 10,700,011 B2 | 6/2020 | Yang et al. | |
| 10,790,162 B2* | 9/2020 | Tsai | H01L 23/5389 |
| 10,797,024 B2 | 10/2020 | Yang et al. | |
| 10,910,233 B2 | 2/2021 | Liu | |
| 11,158,582 B2 | 10/2021 | Kim et al. | |
| 2018/0098430 A1 | 4/2018 | Sato et al. | |
| 2018/0269181 A1 | 9/2018 | Yang et al. | |
| 2018/0323170 A1 | 11/2018 | Kim et al. | |

\* cited by examiner

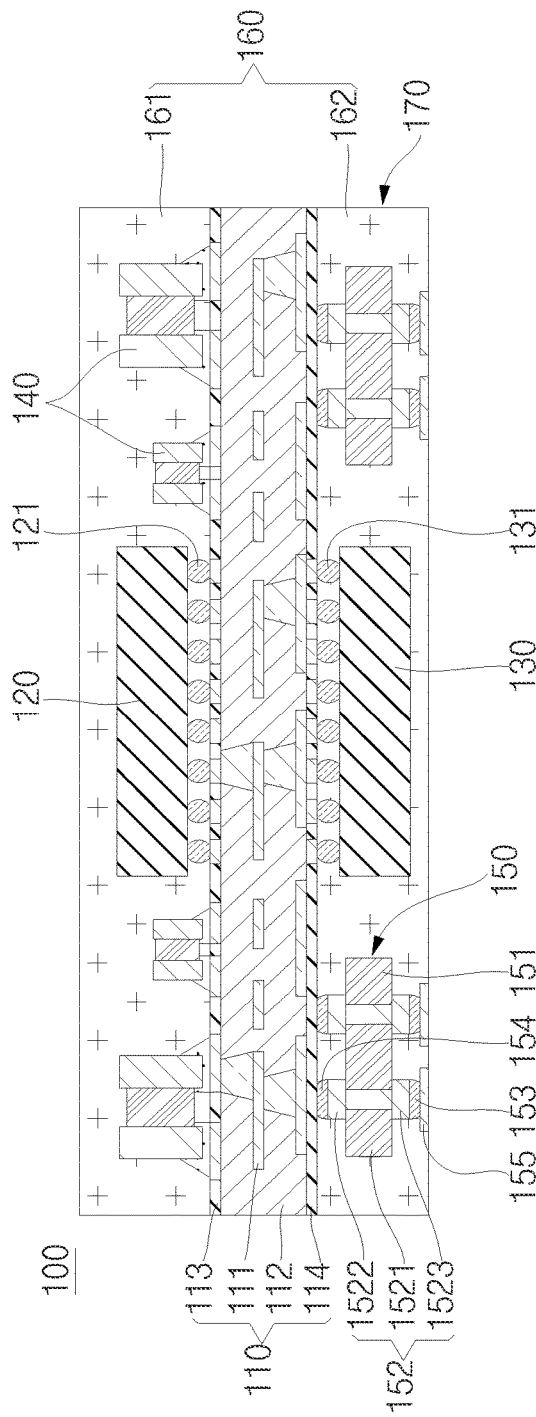
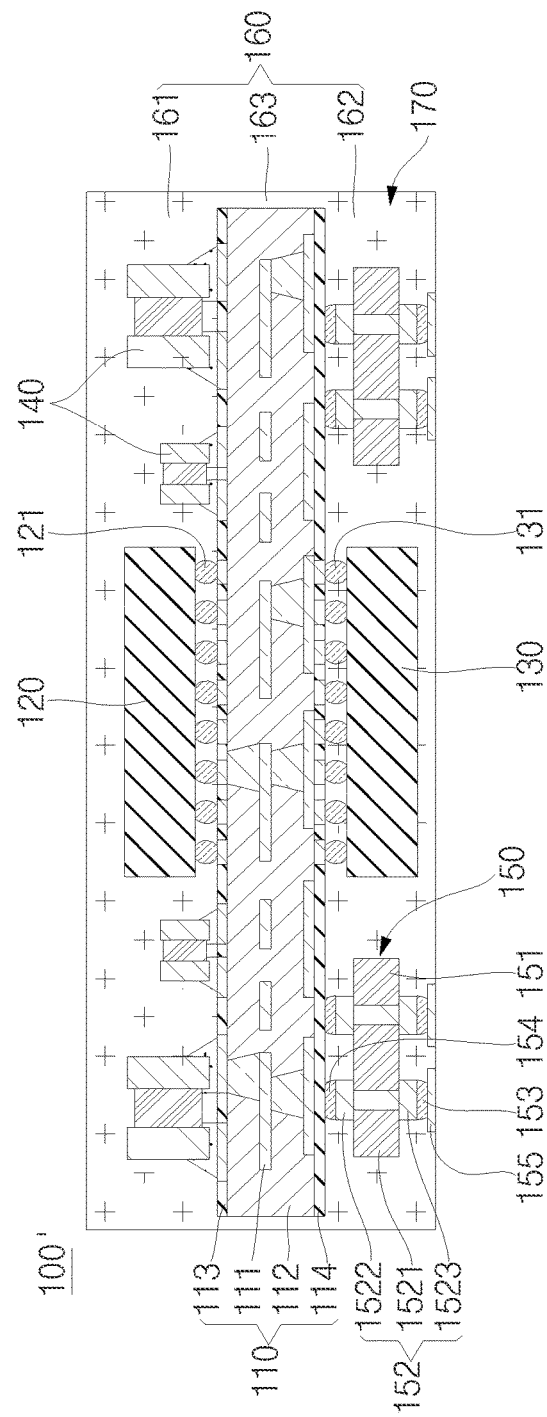
FIG. 1A
FIG. 1B

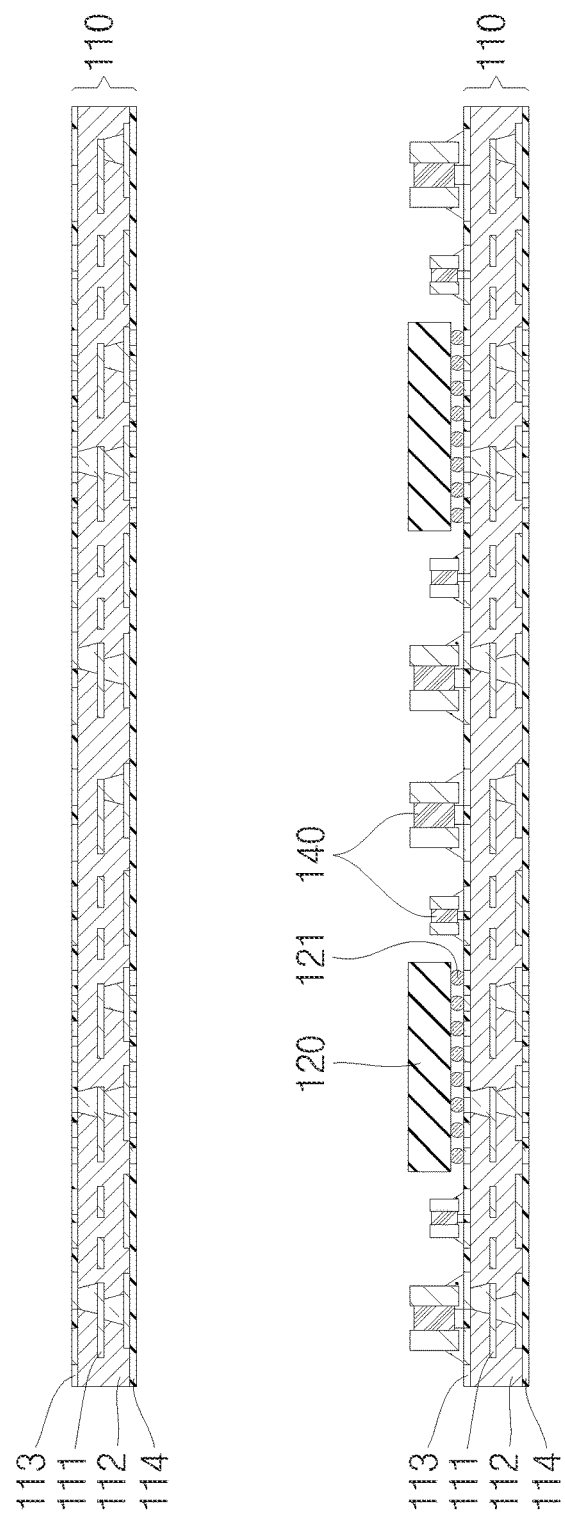

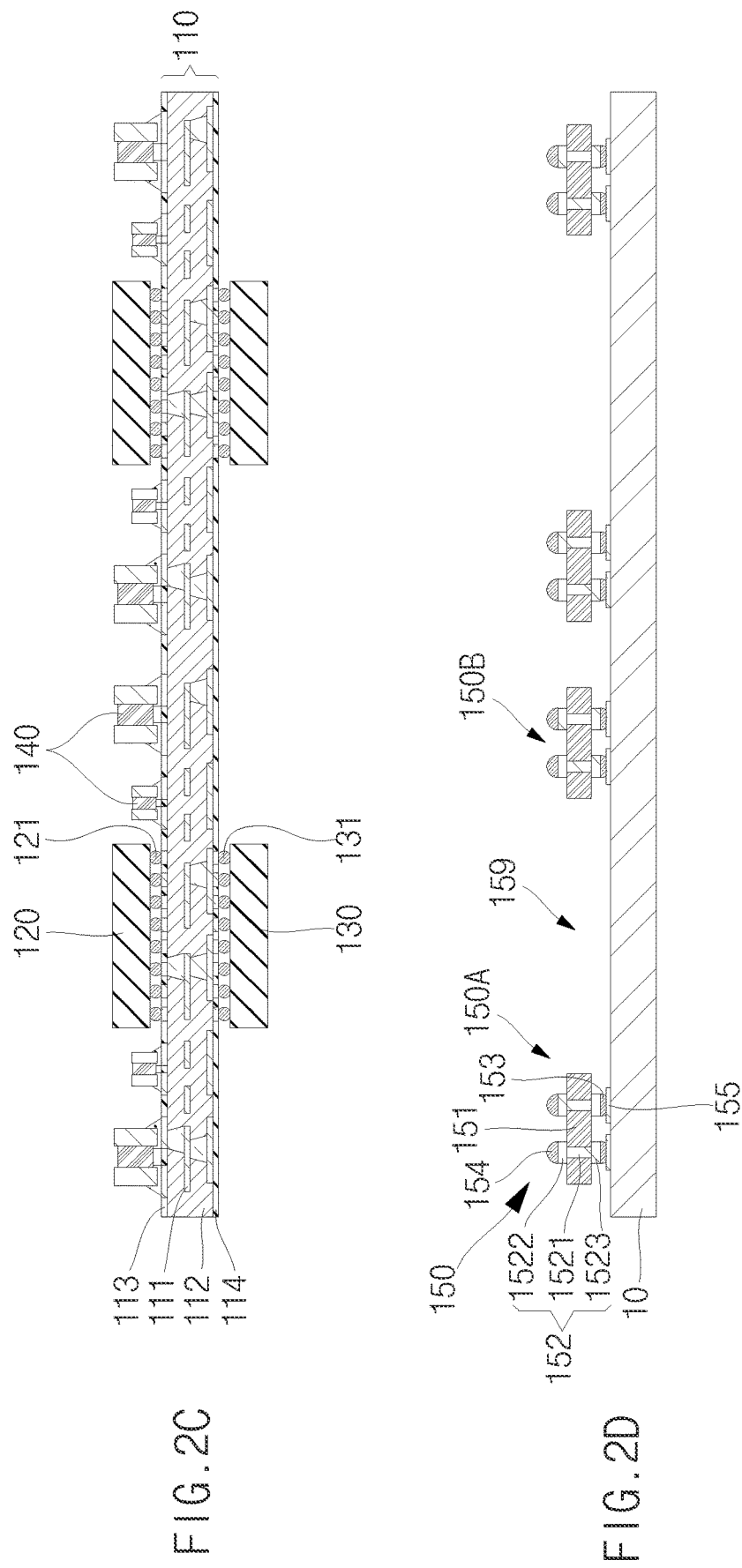

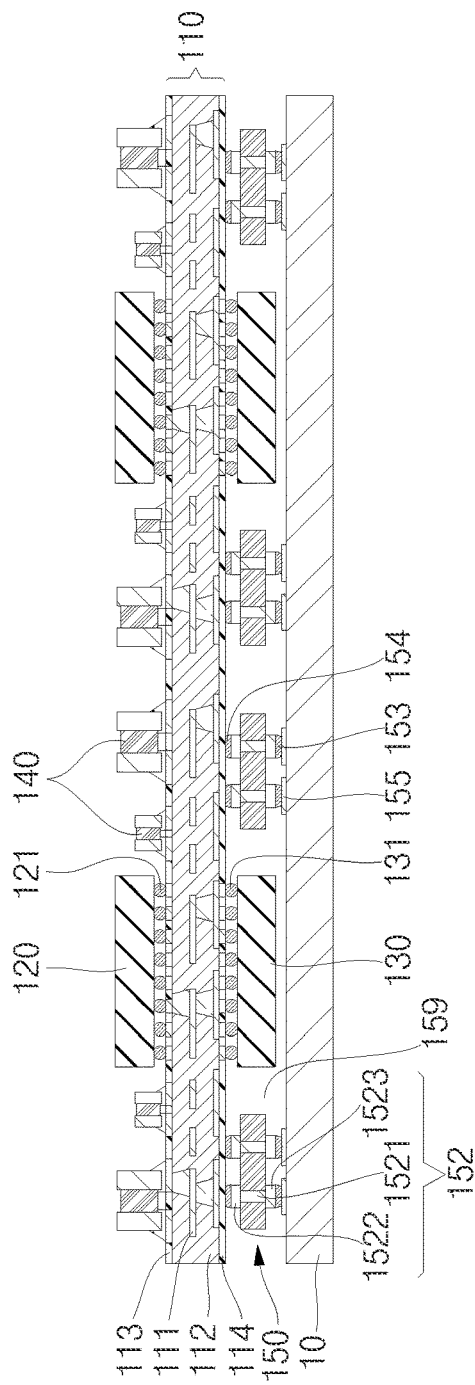
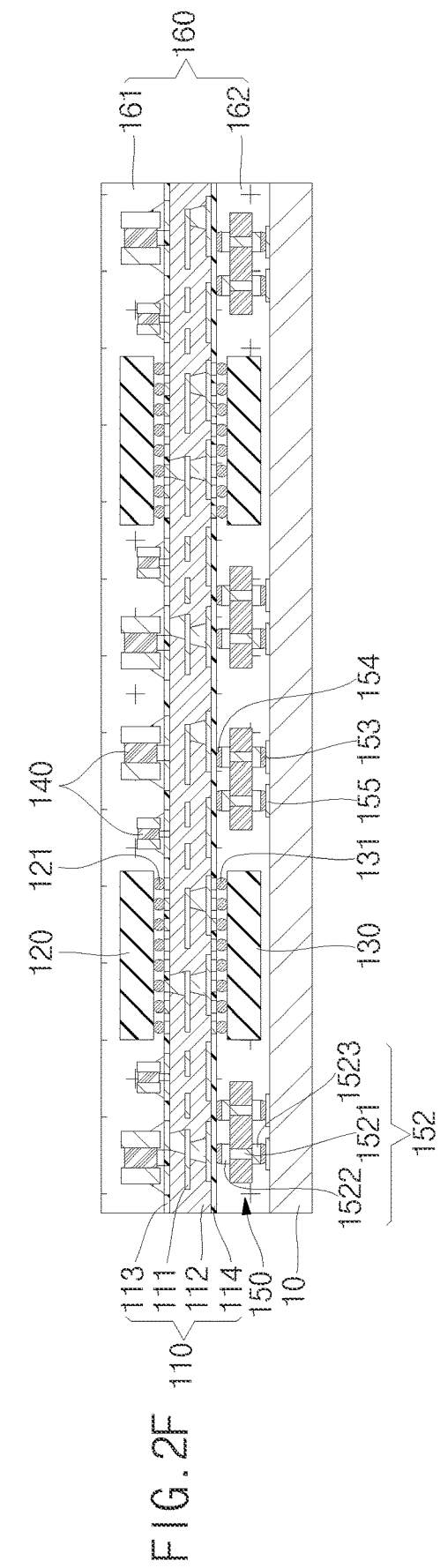

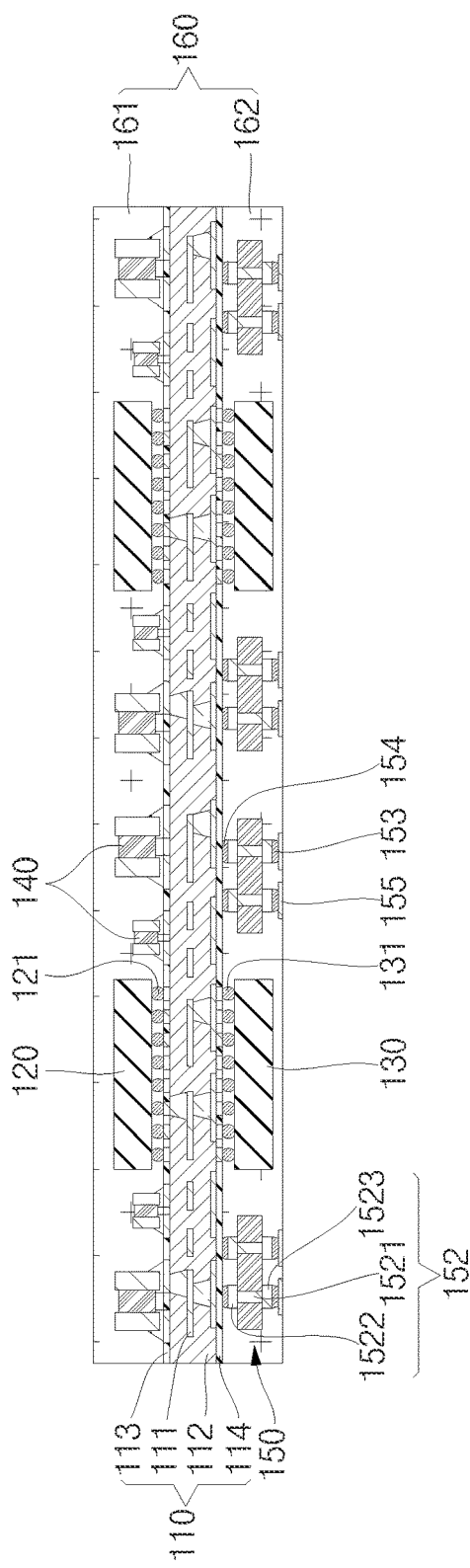
F I G. 2G
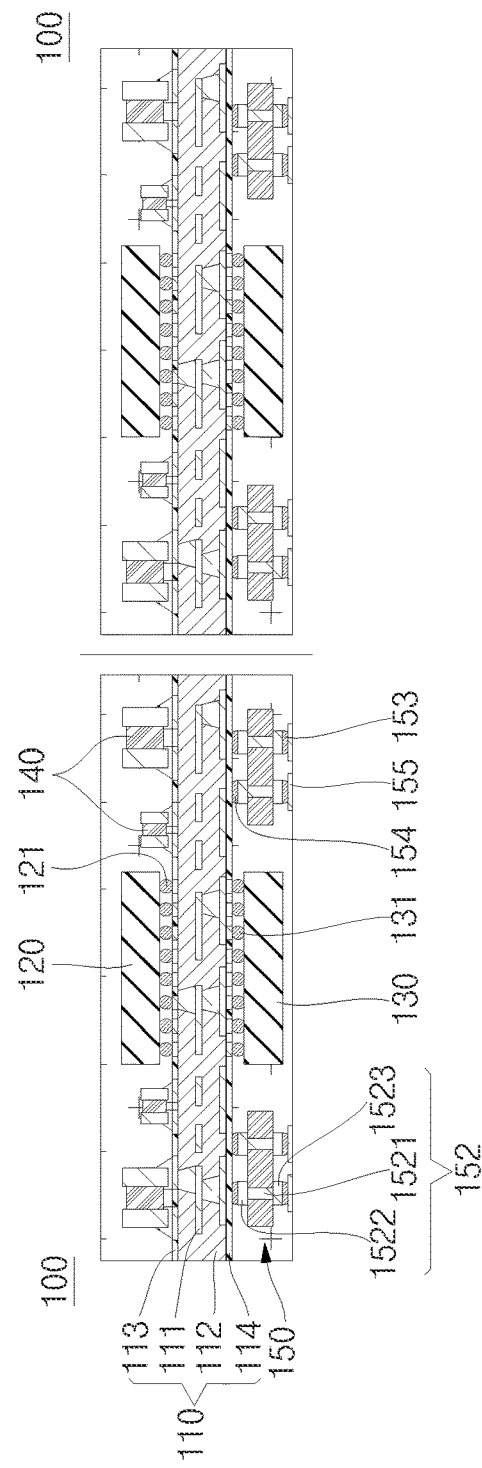
F I G. 2H

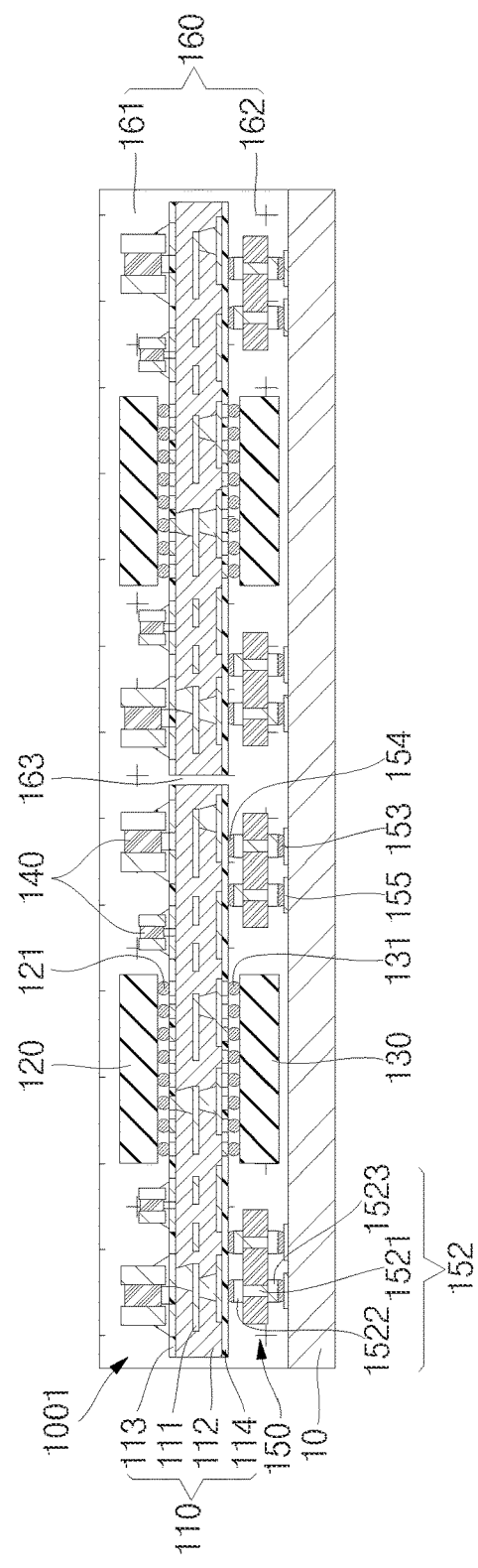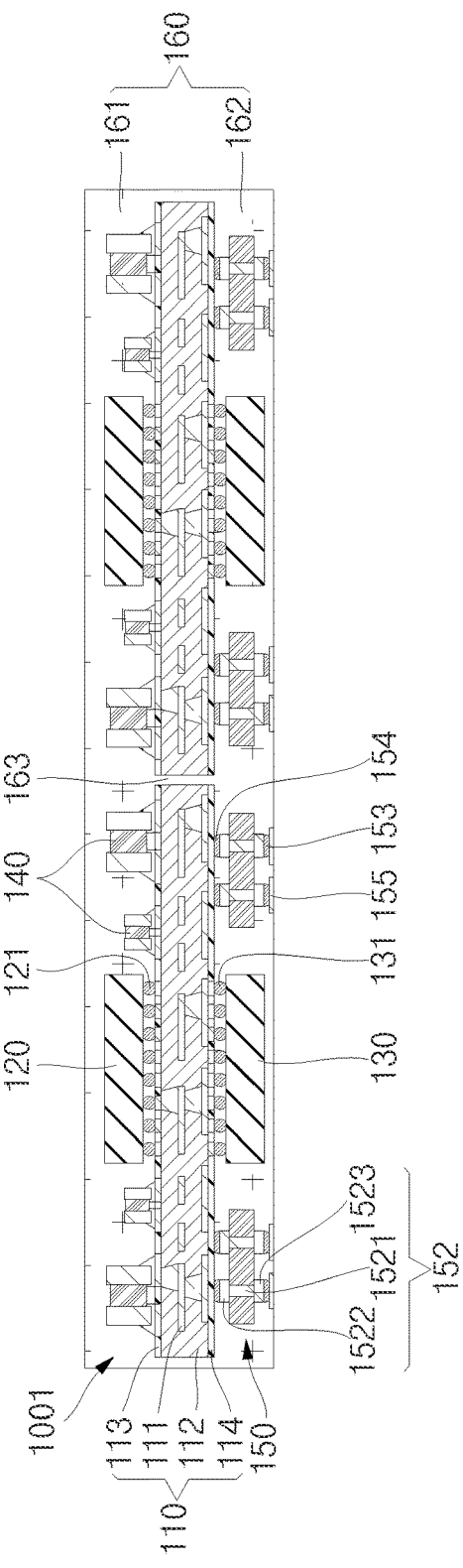

SEMICONDUCTOR DEVICES AND METHODS OF MANUFACTURING SEMICONDUCTOR DEVICES

CROSS-REFERENCE TO RELATED APPLICATIONS

The present application is a continuation of U.S. application Ser. No. 17/510,528 filed Oct. 26, 2021 (pending) which in turn is a continuation of U.S. application Ser. No. 16/703,240 filed Dec. 4, 2019, now U.S. Pat. No. 11,158,582 issued Oct. 26, 2021. Said application Ser. No. 17/510,528, said application Ser. No. 16/703,240, and said U.S. Pat. No. 11,158,582 are hereby incorporated by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 1A to 1B show cross-sectional views of example semiconductor devices.

FIGS. 2A to 2H show cross-sectional views of an example method for manufacturing an example semiconductor device.

FIGS. 4A to 4I show cross-sectional views of an example method for manufacturing an example semiconductor device.

Figure 3A:
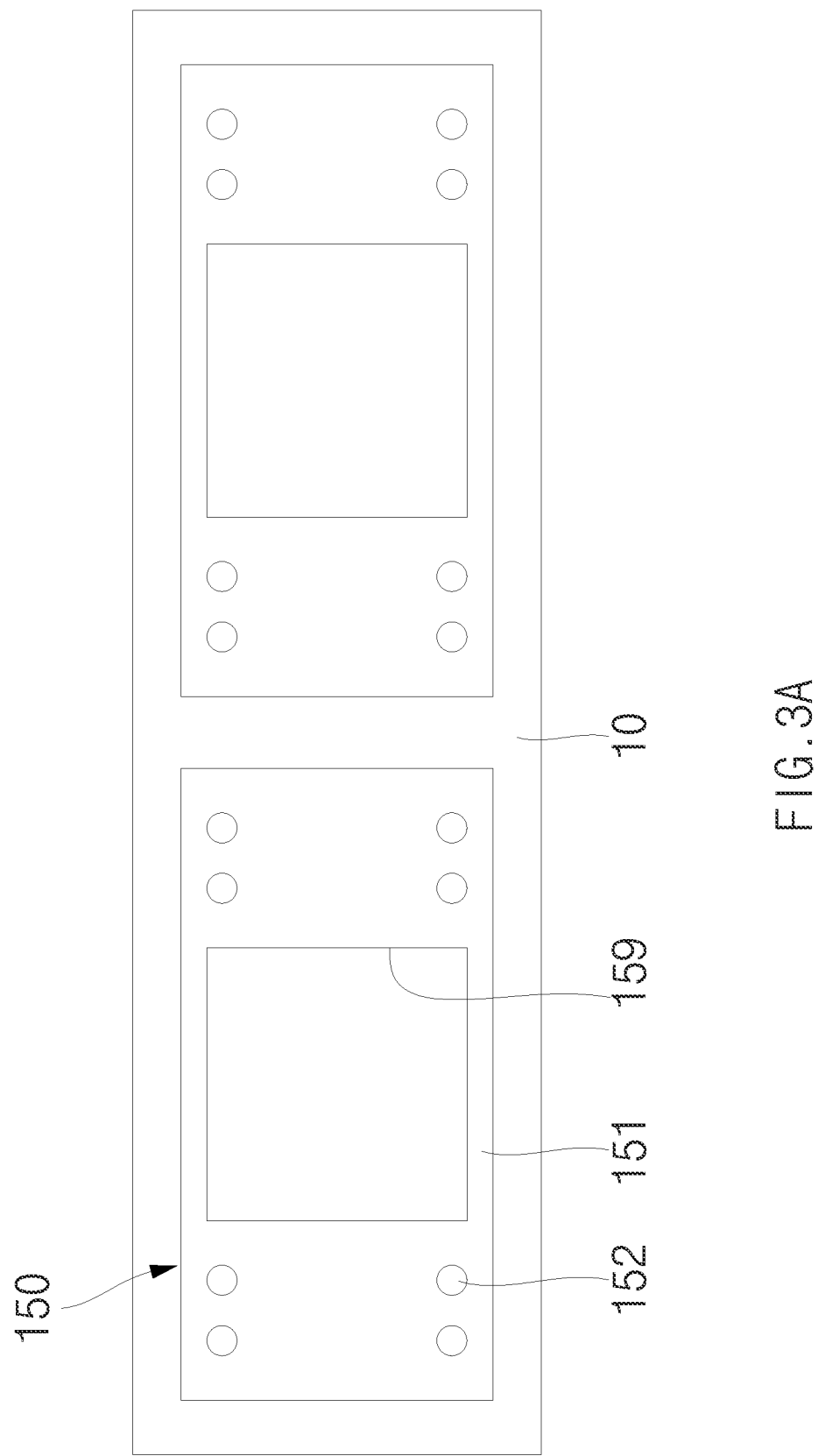
FIGS. 3A to 3C are plan views showing various examples of substrate structure shown in FIG. 2D.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a main substrate having a top side and a bottom side, a first electronic component on the top side of the main substrate, a second electronic component on the bottom side of the main substrate, a substrate structure on the bottom side of the main substrate adjacent to the second electronic component, and an encapsulant structure comprising an encapsulant top portion on the top side of the main substrate and contacting a side of the first electronic component, and an encapsulant bottom portion on the bottom side of the main substrate and contacting a side of the second electronic component and a side of the substrate structure.

In another example, a method to manufacture a semiconductor device, comprises providing a main substrate having a top side and a bottom side, providing a first electronic component on the top side of the main substrate, providing a second electronic component on the bottom side of the main substrate, providing a carrier having a substrate structure on a top side of the carrier, attaching the substrate structure to the bottom side of the main substrate adjacent to the second electronic component, providing an encapsulant structure on the top side of the substrate and on the bottom side of the substrate in a single encapsulation operation, and removing the carrier from the bottom side of the main substrate.

In yet another example, a method to manufacture a semiconductor device, comprises providing a main substrate having a first electronic component on a top side, and a second electronic component on a bottom side, providing a substrate structure attached to a carrier, attaching the substrate structure to the bottom side of the main substrate adjacent to the second electronic component, providing a molding compound on the top side of the main substrate to contact a side of the first electronic component, and between the bottom side of the main substrate and the carrier to contact a side of the second electronic component and the substrate structure, and removing the carrier.

Other examples are included in the present disclosure. Such examples may be found in the figures, in the claims, or in the description of the present disclosure.

FIG. 1A shows a cross-sectional view of an example semiconductor device 100. In the example shown in FIG. 1, semiconductor device 100 can comprise main substrate 110, electronic components 120, 130, or 140, substrate structure 150, or encapsulant structure 160.

Main substrate 110 can comprise conductive structure 111, dielectric structure 112, and dielectric layers 113 or 114. Electronic components 120 and 130 can comprise or be coupled to interconnects 121 or 131, respectively. Substrate structure 150 can comprise dielectric structure 151, conductive structure 152, external interconnect 153, internal interconnect 154, or connection pad 155. In addition, conductive structure 152 can comprise via 1521 or pads 1522, 1523. Encapsulant structure 160 can comprise encapsulant top portion 161 and encapsulant bottom portion 162.

Main substrate 110, substrate structure 150, and encapsulant structure 160 can comprise or be referred to as semiconductor package 170 or package, and semiconductor package 170 can provide protection for electronic components 120, 130, or 140 from external elements or environmental exposure. In addition, semiconductor package 170 can provide electrical coupling between external components and electronic components 120, 130, or 140.

In some examples, semiconductor device 100 can comprise main substrate 110 having a top side and a bottom side. A first electronic component 120 or 140 can be on the top side of main substrate 110, and a second electronic component 130 can be on the bottom side of main substrate 110. A substrate structure 150 can be on the bottom side of main substrate 110 adjacent to the second electronic component 130. An encapsulant structure 160 can comprise an encapsulant top portion 161 on the top side of main substrate 110 and contacting a side of first electronic component 120 or 140, and an encapsulant bottom portion 162 on the bottom side of main substrate 110 and contacting a side of the second electronic component 130 and a side of substrate structure 150.

In some examples, substrate structure 150 can comprise a dielectric structure 151 and a conductive structure or via 1521 that traverses through the dielectric structure 150 and can comprise an internal interconnect 154 coupled to the bottom side of main substrate and an external interconnect exposed 153 from or through the encapsulant bottom portion 162. In some examples, the conductive structure 1521 of the substrate structure 150 can lack lateral traces and can comprise a top pad 1522 where the internal interconnect 154 is coupled, a bottom pad 1523 where the external interconnect 153 is coupled, and a vertical via extending from the internal interconnect 154 to the external interconnect 153.

In some examples, the encapsulant top portion 161 and the encapsulant bottom portion 162 can have the same encapsulant material composition, for example where the encapsulant material for the encapsulant top portion 161 is the same or essentially the same encapsulant material as the encapsulant bottom portion 161. In other examples, the encapsulant material for the encapsulant top portion 161 can be a different material than the encapsulant material for the encapsulant bottom portion 162. Composition can refer to type, ratio, or arrangement of atoms or molecules in a substance or a chemical. In further examples, the material concentrations or densities can the same or essentially the same for the encapsulant top portion 161 and the encapsulant bottom portion 162, or they can have different material concentrations or densities, and the scope of the disclosed subject matter is not limited in these respects. Concentration or density can refer to an amount of substance in a defined space, or a ratio of solute in a solution to solvent or total solution, for example expressed as mass per unit volume.

FIG. 1B shows a cross-sectional view of an example semiconductor device 100'. Semiconductor device 100' can be similar to semiconductor device 100 of FIG. 1A but comprises encapsulant structure 160 having encapsulant top portion 161, encapsulant bottom portion 162, and encapsulant intermediary portion 163. In some examples, the encapsulant intermediary portion 163 can cover a sidewall of main substrate 110 on one or both sides of main substrate 110.

FIGS. 2A to 2H show cross-sectional views of an example method for manufacturing an example semiconductor device. FIG. 2A shows a cross-sectional view of an early stage of manufacture for semiconductor device 100. In the example shown in FIG. 2A, main substrate 110 can be prepared or provided wherein main substrate 110 can comprise conductive structure 111, dielectric structure 112, and dielectric layers 113 or 114. Main substrate 110 can have a top side and a bottom side. The thickness of main substrate 110 can range from about 70 micrometers ($\mu$m) to about 990 $\mu$m.

Conductive structure 111 can comprise one or more conductive layers. In some examples, a conductive layer of conductive structure 111 can comprise or be referred to as one or more conductive patterns, conductors, conductive materials, conductive paths, conductive layers, redistribution layers (RDL), wiring patterns, circuit patterns, traces, or vias along which signals, power, currents, or voltages can be carried or redistributed across main substrate 110. In addition, one or more portions of a layer of conductive structure 111 can have or can be formed or provided with one or more sublayers of one or more conductive materials stacked on each other. Conductive structure 111 can comprise, for example, electrically conductive material such as gold (Au), silver (Ag), copper (Cu), aluminum (Al), palladium (Pd), titanium (Ti), tungsten (W), titanium/tungsten (Ti/W), or nickel (Ni). Conductive structure 111 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Conductive structure 111 can be exposed at a first side (e.g., a top side) and a second side (e.g., a bottom side) of main substrate 110 to be electrically connected to electronic components 120, 130, or 140 and substrate structure 150.

In some examples, dielectric structure 112 can comprise or be referred to as one or more dielectrics, dielectric materials, dielectric layers, passivation layers, insulation layers, or protection layers. In some examples, dielectric structure 112 can comprise an electrically insulating material such as an oxide layer, a nitride layer, polyimide (PI), polypropylene (PP), polyethylene (PE), benzocyclobutene (BCB), polybenzoxazole (PBO), bismaleimide triazine (BT), phenol resin, epoxy resin, silicon resin, or acrylate polymer. Dielectric structure 112 can be formed using, for example, thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. Conductive structure 111 and dielectric structure 112 can constitute main substrate 110 by alternately stacking one or more conductive layers and dielectric layers.

In some examples, dielectric layers 113 or 114 can comprise or be referred to as a solder resist or a solder mask. In some examples, dielectric layers 113 or 114 can comprise an electrically insulating material such as an oxide layer, a nitride layer, polyimide (PI), benzocyclobutene (BCB), polybenzoxazole (PBO), bismaleimide triazine (BT), phenol resin, epoxy resin, silicon resin, or acrylate polymer. In some examples, dielectric layers 113 or 114 can be formed by printing, screen coating, roll coating, curtain coating, sheet lamination, PVD, CVD, MOCVD, ALD, LPCVD, or PECVD. In some examples, the thickness of dielectric layers 113 or 114 can range from about 10 µm to about 35 µm. Dielectric layers 113 or 114 can be formed to cover first side or second side of main substrate 110. In addition, portions of dielectric layers 113 or 114 can be removed to expose a portion of conductive structure 111 at first or second sides of main substrate 110. Dielectric layers 113 or 114 can prevent a short circuit, corrosion, or contamination from occurring to conductive structure 111 or can protect main substrate 110 from external shocks, moisture, or chemical substance.

In some examples, main substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, main substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In some examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

FIG. 2B shows a cross-sectional view of a later stage of manufacture for semiconductor device 100. In the example shown in FIG. 2B, electronic components 120 or 140 can be provided or attached to first side or top side of main substrate 110. In some examples, electronic component 120 can comprise or be referred to as a semiconductor die, a semiconductor chip, or a semiconductor package, such as chip-scale packages. Semiconductor die 120 can comprise, for example, electrical circuits, such as a memory, a digital signal processor (DSP), a microprocessor, a Micro-Electro-Mechanical-System (MEMS) device, a network processor, a power management processor, an audio processor, a radio-frequency (RF) circuit, a wireless baseband system-on-chip (SoC) processor, a sensor, or an application specific integrated circuit (ASIC). Semiconductor die 120 can comprise interconnects 121. In some examples, interconnects 121 can comprise or be referred to as conductive balls such as solder balls, conductive pillars such as copper pillars, or conductive posts having solder caps formed on copper pillars. Interconnects 121 can be formed on a bottom side of semiconductor die 120 to then be electrically connected to conductive structure 111 of main substrate 110. Semiconductor die 120 can be electrically connected to conductive structure 111, for example by mass reflow, thermal compression, or laser assisted bonding. The height of semiconductor die 120 can range from about 50 µm to about 780 µm.

In some examples, electronic component 140 can comprise or be referred to as a passive component such as a resistor, a capacitor, or an inductor, or an active component such as a diode or a transistor. Passive component 140 can be electrically connected to conductive structure 111 to first side of main substrate 110 through a solder. Passive component 140 can be electrically connected to conductive structure 111 by, for example, mass reflow, thermal compression or laser assisted bonding. In some examples, semiconductor die 120 can be positioned at the center of main substrate 110, and passive component 140 can be positioned around semiconductor die 120. The height of passive component 140 can range from about 100 µm to about 1000 µm.

FIG. 2C shows a cross-sectional view of a later stage of manufacture for semiconductor device 100. In the example shown in FIG. 2C, electronic component 130 can be provided or attached to second side or bottom side of main substrate 110. In some examples, electronic component 130 can comprise or be referred to as a semiconductor die, a semiconductor chips, or a semiconductor package such as chip-scale packages. Semiconductor die 130 can comprise, for example, electrical circuits, such as a memory, a digital signal processor (DSP), a microprocessor, a Micro-Electro-Mechanical-System (MEMS) device, a network processor, a power management processor, an audio processor, a radio-frequency (RF) circuit, a wireless baseband system-on-chip (SoC) processor, a sensor, or an application specific integrated circuit (ASIC). Semiconductor die 130 can comprise interconnects 131. In some examples, interconnects 131 can comprise or be referred to as conductive balls such as solder balls, conductive pillars such as copper pillars, or conductive posts having solder caps formed on copper pillars. Interconnects 131 can be formed on a top side of semiconductor die 130 to then be electrically connected to conductive structure 111 exposed to second side of main substrate 110. Semiconductor die 130 can be electrically connected to conductive structure 111, for example by mass reflow, thermal compression, or laser assisted bonding. The height of semiconductor die 130 can range from about 50 µm to about 500 µm.

Figure 3B:
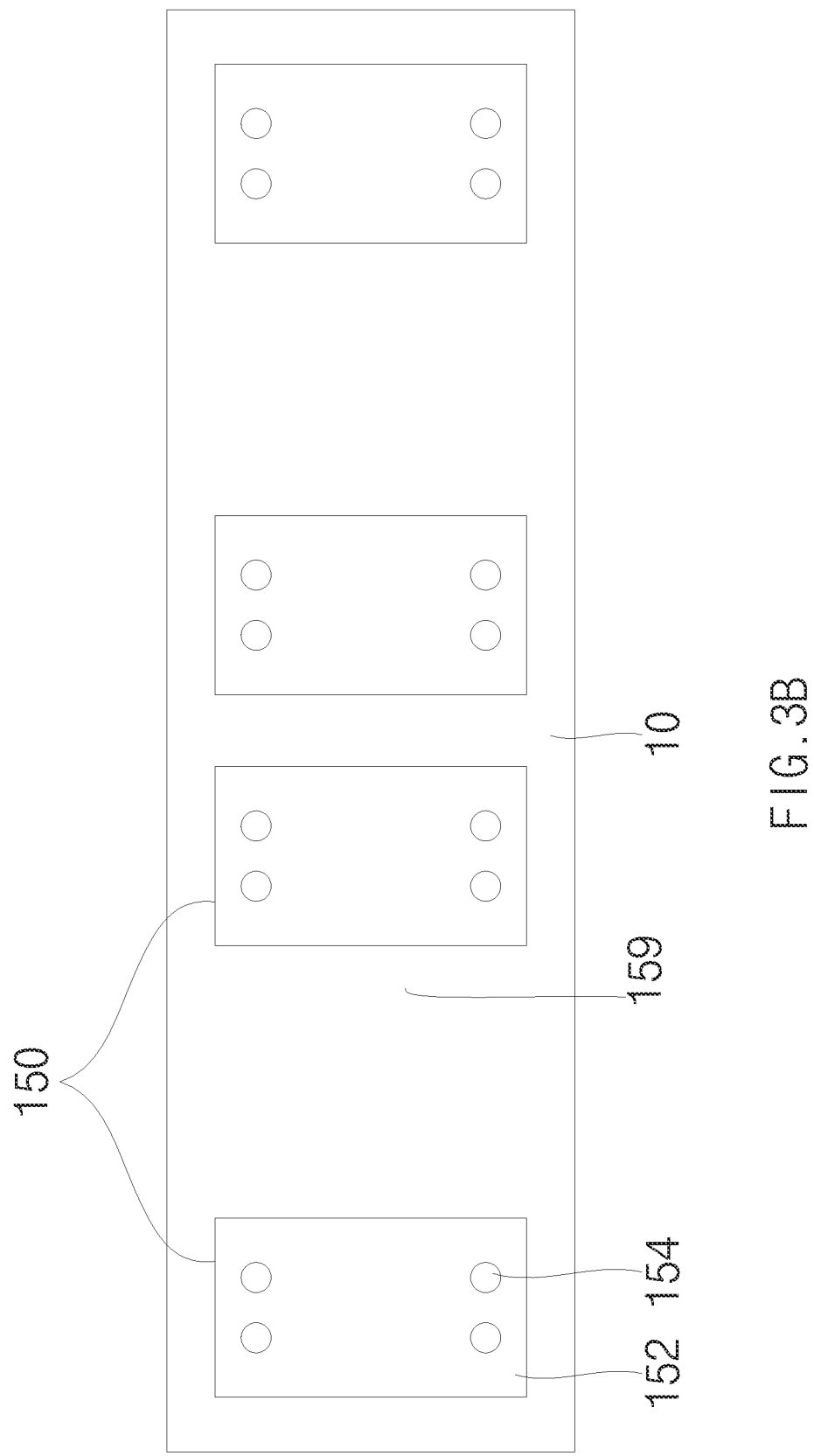
Figure 3C:
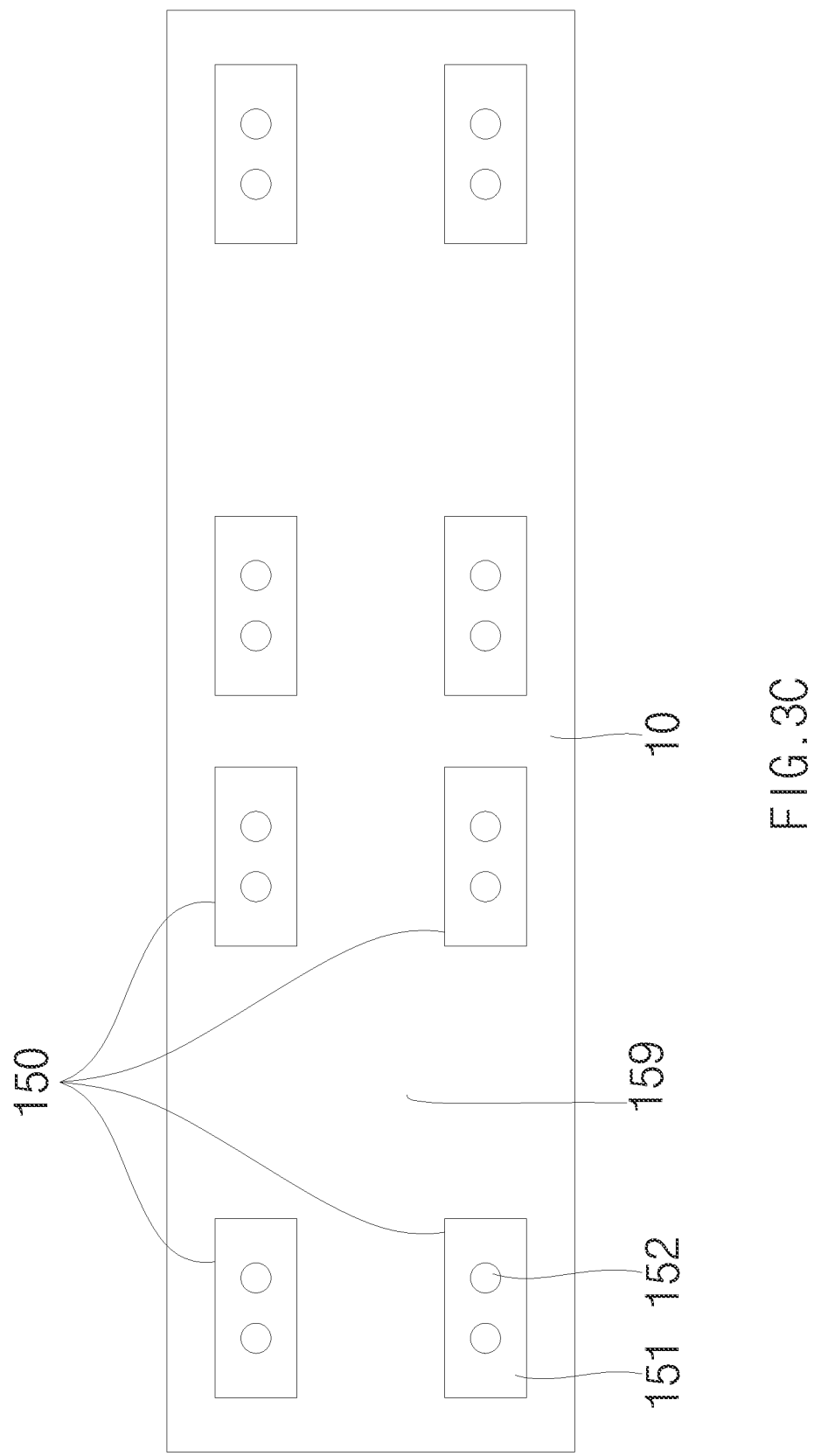

FIG. 2D shows a cross-sectional view of a later stage of manufacture for semiconductor device 100. Substrate structure 150 of FIG. 2D is also shown in FIGS. 3A to 3C as plan views showing various examples of substrate structure 150. In the example shown in FIG. 2D, substrate structure 150 can be provided or attached onto a carrier 10. In some examples, carrier 10 can comprise silicon, glass, a metal, an adhesive film, or an adhesive tape. For example, when carrier 10 comprises silicon, glass, or a metal, substrate structure 150 can be attached to carrier 10 using a separate adhesion member. In some examples, connection pad 155 can be formed or provided on a top side of carrier 10, and substrate structure 150 can be attached to top side of carrier 10 to be electrically connected to connection pad 155. In some examples, substrate structure 150 can be attached to top side of carrier 10 without connection pad 155. Substrate structure 150 can comprise substrate perimeter portions 150A or 150B as opposite ends of cavity 159. In some examples, substrate structure 150 can comprise a cavity substrate having substrate perimeter portions 150A and 150B coupled to each other by other perimeter portions of substrate structure 150. In some examples, substrate structure 150 can comprise substrate perimeter portions 150A or 150B as distinct bar or strip substrates separate from each other.

The height of substrate structure 150 can range from about 80 µm to about 500 µm. In some examples, substrate structure 150 can be electrically connected to main substrate 110 to provide electrical connection paths between main substrate 110 and external circuits. In some examples, substrate structure 150 can be formed or provided to have a greater height than semiconductor die 130 attached to main substrate 110. In some examples substrate structure 150 can provide accurate electrical connection paths between main substrate 110 and external circuits or can prevent signal path misalignment to improve the yield of semiconductor device 100. In some examples, substrate structure 150 can prevent warpage from occurring to semiconductor device 100 due to thermal expansion.

Substrate structure 150 can comprise dielectric structure 151, conductive structure 152, external interconnect 153, or internal interconnect 154. In some examples, dielectric structure 151 can comprise or be referred to as a dielectric layer, an insulation layer, or a protection layer. Dielectric structure 151 can comprise, for example, electrically insulating material, such as an oxide layer, a nitride layer, polyimide (PI), polypropylene (PP), polyethylene (PE), benzocyclobutene (BCB), polybenzoxazole (PBO), bismaleimide triazine (BT), phenol resin, epoxy resin, silicon resin, or acrylate polymer. The height of dielectric structure 151 can range from about 40 µm to about 60 µm.

Conductive structure 152 can comprise via 1521 extending through dielectric structure 151, pad 1522 formed on a first side of dielectric structure 151 and electrically connected to via 1521, or pad 1523 formed on a second side of dielectric structure 151 and electrically connected to via 1521. In some examples, conductive structure 152 can comprise an electrically conductive material, such as gold (Au), silver (Ag), copper (Cu), aluminum (Al), palladium (Pd), titanium (Ti), tungsten (W), titanium/tungsten (Ti/W), or nickel (Ni). For example, via 1521 can be formed by forming a via hole in dielectric structure 151 and then filling an electrically conductive material. The height of conductive structure 152 can range from about 100 µm to about 120 µm. Although only two vias 1521 are shown in a portion of conductive structure 152, this is not a limitation of the present disclosure. In some examples, less or more vias 1521 can be formed in dielectric structure 151.

External interconnect 153 can be electrically connected to pad 1523 formed on second side of dielectric structure 151. In some examples, external interconnect 153 can comprise or be referred to as conductive bumps, balls, pillars such as posts or wires, solder bodies, copper bodies, or solder caps. External interconnect 153 can provide electrical contact between semiconductor device 100 and an external circuit. In some examples, external interconnect 153 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. For example, external interconnect 153 can be formed using a ball drop process, a screen-printing process, or an electroplating process. The height of external interconnect 153 can range from about 10 µm to about 20 µm.

Internal interconnect 154 can be electrically connected to pad 1522 formed on first side of dielectric structure 151. In some examples, internal interconnect 154 can comprise or be referred to as conductive bumps, balls, pillars such as posts or wires, solder bodies, copper bodies, or solder caps. Internal interconnect 154 can provide electrical contacts between conductive structure 152 of substrate structure 150 and main substrate 110. Internal interconnect 154 can be electrically connected to conductive structure 111 of main substrate 110. In some examples, internal interconnect 154 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. For example, internal interconnect 154 can be formed by a ball drop process, a screen-printing process, or an electroplating process. The height of internal interconnect 154 can range from about 10 µm to about 20 µm.

In some examples, substrate structure 150 can comprise or be referred to as a base substrate, an embedded substrate, an interface substrate, a cavity substrate, a bar substrate, or an electrical bar (E-Bar). In some examples, for example as shown in FIG. 3A, cavity substrate 150 can comprise dielectric structure 151 comprising a single substrate, conductive structures 152 formed at corners of dielectric structure 151 and formed or provided cavity 159. In some examples, internal interconnects 154 can be formed on conductive structures 152. Since conductive structures 152 attached to individual semiconductor devices 100 are formed or provided on dielectric structure 151 consisting of single substrate, cavity substrate 150 can be easily attached to carrier 10. In some examples, substrate structure 150 comprises a cavity substrate 150 comprising a dielectric structure 151 and a cavity 159 in the dielectric structure 151, and wherein the second electronic 130 component can be bounded by the cavity 159.

In some examples, as shown in FIG. 3B, substrate structure 150 can be composed of two bar substrates separated from each other. The second electronic component 130 can be in a cavity 159 between the two bar substrates. In some examples, as shown in FIG. 3C, substrate structure 150 can comprise four bar substrates separated from each other. The second electronic component 130 can be in a cavity between the four bar substrates. Bar substrate 150 can be applied to various types of semiconductor devices and can have a simplified configuration, increasing productivity and saving production costs accordingly.

In some examples, a process of attaching substrate structures 150 to carrier 10 shown in FIG. 2D can first be performed and a process of attaching electronic components 120, 130, or 140 to main substrate 110 shown in FIGS. 2A to 2C can later be performed. In some examples, the process of attaching electronic components 120, 130, or 140 to main substrate 110 shown in FIGS. 2A to 2C and the process of attaching substrate structures 150 to carrier 10 shown in FIG. 2D can be simultaneously performed in parallel.

FIG. 2E shows a cross-sectional view of a later stage of manufacture for semiconductor device 100. In the example shown in FIG. 2E, main substrate 110 with electronic components 120, 130, or 140 can be provided, attached, or coupled with substrate structure 150 on carrier 10. Substrate structure 150 can be provided, attached or coupled with a second side or bottom side of main substrate 110 adjacent second electronic device 130. Main substrate 110 can be coupled with substrate structure 150 by mass reflow, thermal compression, or laser bonding. Internal interconnect 154 can be electrically connected to conductive structure 111 exposed at second side of main substrate 110. Substrate structure 150 can be positioned around semiconductor die 130 attached to second side of main substrate 110, where semiconductor die 130 can be positioned to be bounded or surrounded by cavity 159 or otherwise within cavity 159.

FIG. 2F shows a cross-sectional view of a later stage of manufacture for semiconductor device 100. In the example shown in FIG. 2F, encapsulant structure 160 can encapsulate main substrate 110, electronic components 120, 130, or 140 and substrate structure 150. Encapsulant structure 160 can comprise encapsulant top portion 161 encapsulating a top portion of main substrate 110 and encapsulant bottom portion 162 encapsulating a bottom portion of main substrate 110. Encapsulant top portion 161 can encapsulate first side of main substrate 110 and electronic components 120 or 140.

Encapsulant top portion 161 can be formed to have a height equal to or greater than heights of electronic components 120 or 140. The height of encapsulant top portion 161 can range from about 100 µm to about 1065 µm. Encapsulant bottom portion 162 can encapsulate second side of main substrate 110, electronic component 130, and substrate structure 150. Encapsulant bottom portion 162 can be formed to have a height equal to a height of substrate structure 150. The height of encapsulant bottom portion 162 can range from about 80 µm to about 500 µm. In some examples, encapsulant bottom portion 162 can expose external interconnect 153 of substrate structure 150. In some examples, encapsulant bottom portion 162 can expose connection pad 155 formed in external interconnect 153.

Encapsulant structure 160 can comprise a variety of encapsulating or molding materials, for example a resin, a polymer composite material, a polymer having a filler, an epoxy resin, an epoxy resin having a filler, epoxy acrylate having a filler, a silicon resin, a pre-preg material, combinations, or equivalents, etc. In some examples, encapsulant structure 160 can be formed by any of a variety of processes including, for example, a transfer molding process, a compression molding process, or a vacuum lamination process. In some examples, encapsulant structure 160 can be formed by mounting a stacked structure having carrier 10, substrate structure 150, main substrate 110, and electronic components 120, 130, or 140 shown in FIG. 2E, in a mold and then inserting a molding material into the mold. In some examples, encapsulant structure 160 comprising encapsulant top portion 161 and encapsulant bottom portion 162 can be formed by a one-time molding process. Encapsulant structure 160 can protect main substrate 110, electronic components 120, 130, or 140, and substrate structure 150 from external environment.

In some examples, encapsulant top portion 161 and encapsulant bottom portion 162 can be formed or applied concurrently during a same manufacturing step or operation to enhance the speed, cost, or efficiency of the manufacturing process. In some examples, encapsulant top portion 161 can be provided on the first side or top side of main substrate 110 and encapsulant bottom portion 162 can be provided on the second side or bottom side of main substrate 110 in a single encapsulation operation. In some examples, however, encapsulant top portion 161 and encapsulant bottom portion 162 can be formed or applied sequentially, one after the other.

FIG. 2G shows a cross-sectional view of a later stage of manufacture for semiconductor device 100. In the example shown in FIG. 2G, carrier 10 can be removed or separated from substrate structure 150 and encapsulant bottom portion 162. In some examples, carrier 10 can be removed by grinding. In some examples, carrier 10 can be separated from substrate structure 150 and encapsulant bottom portion 162 by heat, a chemical substance, UV light, or a physical force. Connection pad 155 formed in external interconnects 153 of substrate structure 150 can be exposed. In some examples, when carrier 10 is removed or separated from substrate structure 150 and encapsulant bottom portion 162, connection pad 155 can also be removed or separated from substrate structure 150 and encapsulant bottom portion 162, and external interconnect 153 of substrate structure 150 can be exposed.

In some examples, a method to manufacture semiconductor device 100 can include providing main substrate 110 having a first electronic component 120 or 140 on a top side of main substrate (FIG. 2B), and a second electronic component 130 on a bottom side of main substrate (FIG. 2C). A substrate structure 150 attached to a carrier 10 can be provided (FIG. 2D), and the substrate structure 150 can be attached to the second side or bottom side of main substrate 110 adjacent to the second electronic component 130 (FIG. 2E). A molding compound 160 can be provided on the first side or top side of main substrate 110 to contact a side of the first electronic component 120 or 140, and between the bottom side of main substrate 110 and the carrier 10 to contact a side of the second electronic component 130 and a side of the substrate structure (FIG. 2F). the carrier 10 can then be removed (FIG. 2G). In some examples, the molding compound can be provided in a single molding operation. In further examples, main substrate 110 can be sawed into multiple individual modules prior to attaching the substrate structure 150 to the bottom side of the main substrate.

FIG. 2H shows a cross-sectional view of a later stage of manufacture for semiconductor device 100. In the example shown in FIG. 2H, individual semiconductor devices 100 can be provided by singulating through main substrate 110 and encapsulant structure 160 together. In some examples, the singulation process can be performed using a sawing tool, such as a diamond blade or laser beam. In some examples, singulation can comprise cutting through the encapsulant structure 160 and main substrate 110 after removing the carrier 10 to provide multiple semiconductor devices 100. In other examples, singulation can comprise cutting through main substrate 110 prior to attaching substrate structure 150 to provide multiple modules, wherein substrate structure 150 is attached to a second side or a bottom side of one of the multiple modules, and the encapsulant structure 160 comprises an encapsulant intermediary portion 163 between adjacent ones of the multiple modules. After providing the encapsulant structure 160, singulation further can comprise cutting through the encapsulant intermediary portion 163. In some examples, a cutting path at the encapsulant intermediary portion 163 can be narrower than the encapsulant intermediary portion 163 such that part of the encapsulant intermediary portion 163 remains covering a sidewall of the main substrate after cutting. In other examples, a cutting path at the encapsulant intermediary portion 163 can be at least as wide as the encapsulant intermediary portion 163 such that a sidewall of main substrate 110 is exposed through the encapsulant structure 160.

Figure 4A:
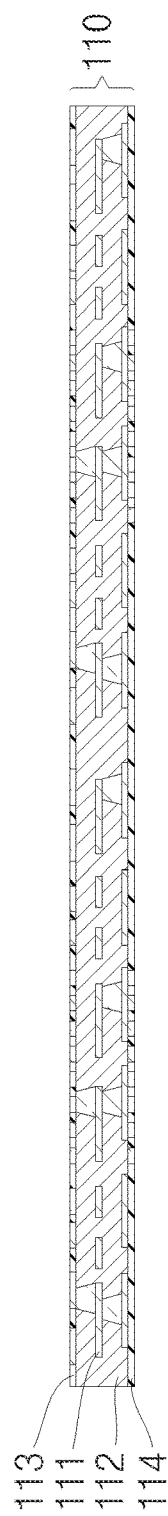
Figure 4B:
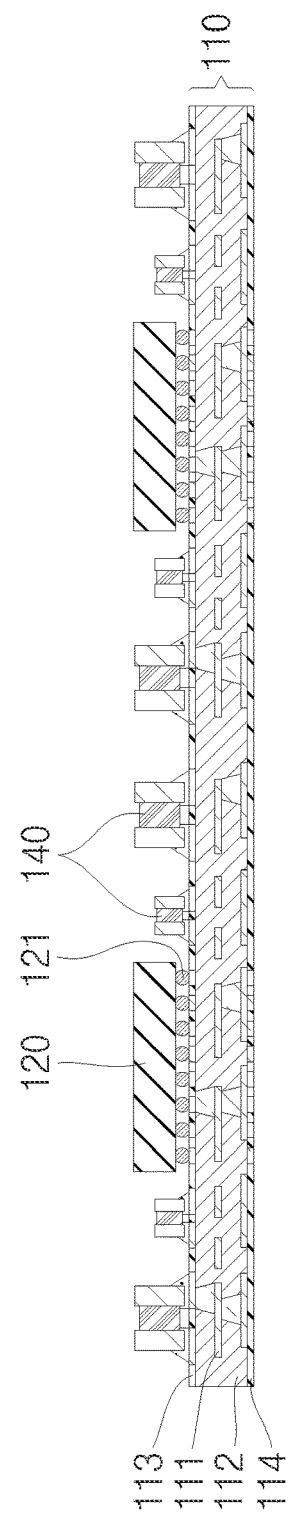
Figure 4C:
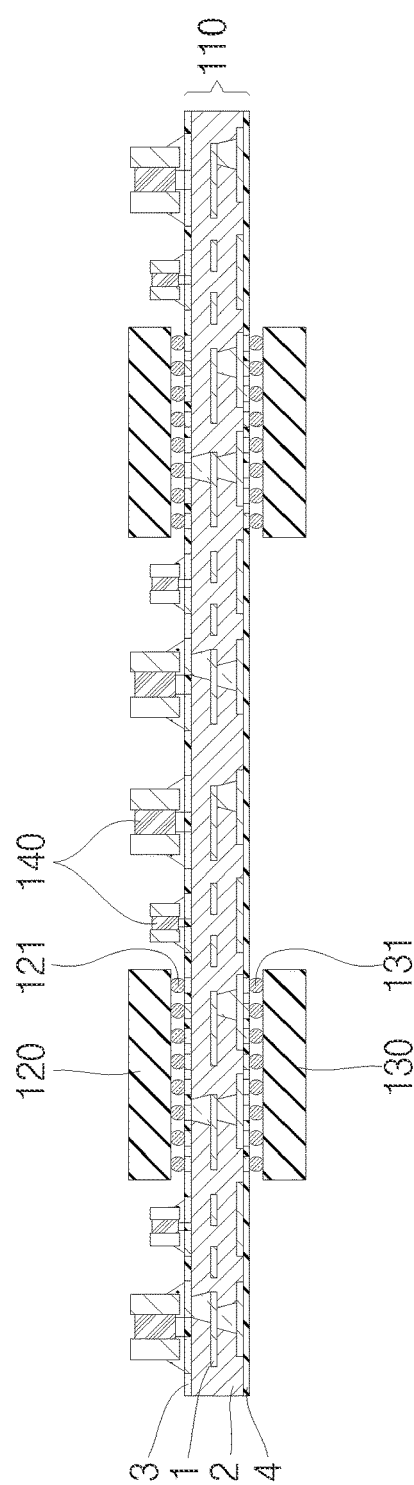

FIGS. 4A to 4I show cross-sectional views of an example method for manufacturing an example semiconductor device 100'. Semiconductor device manufacturing stages shown in FIGS. 4A to 4C are similar to those shown in FIGS. 2A to 2C.

FIG. 4A shows a cross-sectional view at an early stage of manufacture for semiconductor device 100'. In the example shown in FIG. 4A, main substrate 110 comprising conductive structure 111, dielectric structure 112, and dielectric layers 113 or 114, can be prepared.

FIG. 4B shows a cross-sectional view at a later stage of manufacture for semiconductor device 100'. In the example shown in FIG. 4B, electronic components 120 or 140 can be attached to first side of main substrate 110. In some examples, electronic component 120 can comprise a semiconductor die or a semiconductor package. In addition, electronic component 140 can comprise a passive component, such as a resistor, a capacitor, or an inductor, or an active component, such as a diode or a transistor.

FIG. 4C shows a cross-sectional view at a later stage of manufacture for semiconductor device 100'. In the example shown in FIG. 4C, electronic component 130 can be attached to second side of main substrate 110. In some examples, electronic component 130 can comprise a semiconductor die or a semiconductor package.

Figure 4D:
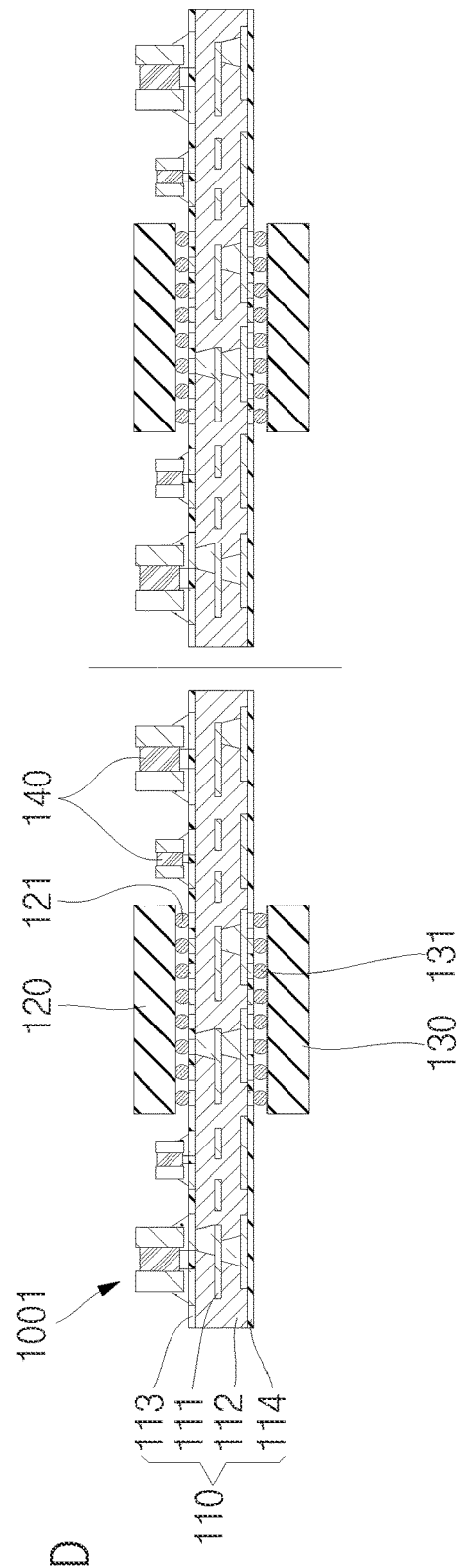

FIG. 4D shows a cross-sectional view at a later stage of manufacture for semiconductor device 100'. In the example shown in FIG. 4D, main substrate 110 and electronic components 120, 130, or 140 can be pre-singulated into individual modules by singulating through main substrate 110. Separated main substrate 110 and electronic components 120, 130, or 140 attached to first and second sides of main substrate 110 can be referred to as semiconductor module 1001. In some examples, the pre-singulation process can be performed using a sawing tool, such as a diamond blade or laser beam.

Figure 4E:
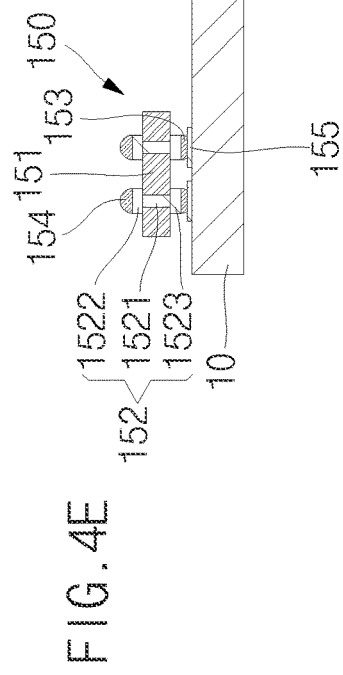

FIG. 4E shows a cross-sectional view at a later stage of manufacture for semiconductor device 100'. In the example shown in FIG. 4E, substrate structure 150 can be coupled with carrier 10. In some examples, the stage shown at FIG. 4E can be similar to that described with respect to FIG. 2D.

In some examples, the process of attaching substrate structure 150 to carrier 10 shown in FIG. 4E can first be performed, and the process of attaching electronic components 120, 130, or 140 to main substrate 110 and sawing main substrate 110 shown in FIGS. 4A to 4D can later be performed. In some examples, the process of attaching electronic components 120, 130, or 140 to main substrate 110 and sawing main substrate 110 shown in FIGS. 4A to 4D and the process of attaching substrate structure 150 to carrier 10 shown in FIG. 4E can be concurrently performed in parallel.

Figure 4F:
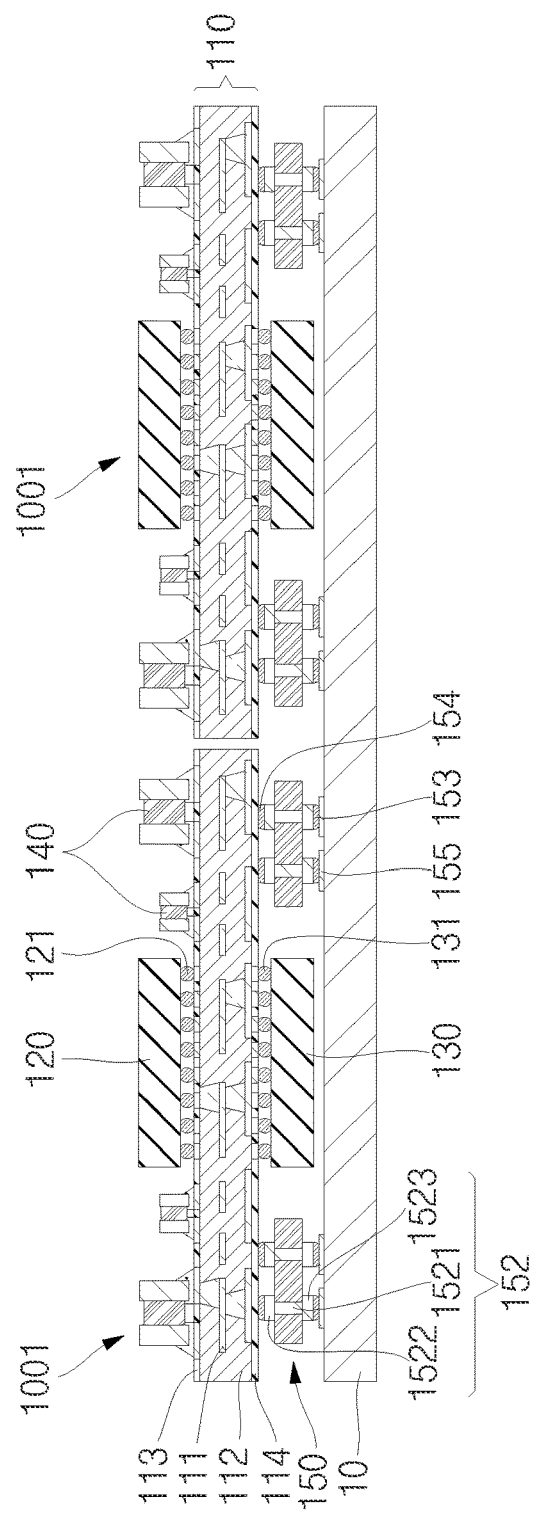
Figure 41:
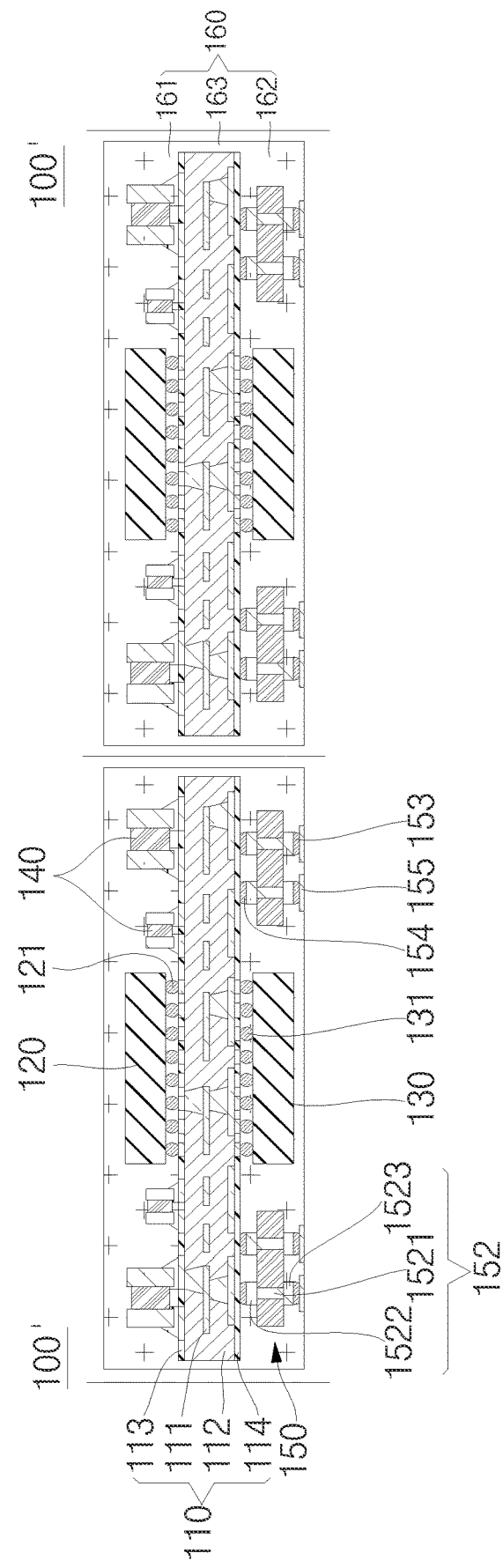

FIG. 4F shows a cross-sectional view of semiconductor device at a later stage of manufacture. In the example shown in FIG. 4F, multiple semiconductor modules 1001 can be coupled with substrate structures 150 on carrier 10. In some examples, the stage shown at FIG. 4F can be similar to that described above with respect to FIG. 2E, but with semiconductor modules 1001 being pre-singulated and attached individually. Semiconductor modules 1001 can be attached onto carrier 10 such that internal interconnect 154 contacts conductive structure 111 exposed at second side of main substrate 110. Semiconductor modules 1001 can be attached onto carrier 10 by mass reflow, thermal compression, or laser bonding. Internal interconnects 154 can be electrically connected to conductive structure 111 exposed at second side of main substrate 110. In some examples, substrate structure 150 can be positioned around semiconductor die 130 attached to second side of main substrate 110.

FIG. 4G shows a cross-sectional view at a later stage of manufacture for semiconductor device 100'. In the example shown in FIG. 4G, encapsulant structure 160 can encapsulate multiple semiconductor modules 1001 and substrate structure 150. In some examples, the stage shown at FIG. 4G can be similar to that described above with respect to FIG. 2F, but with semiconductor modules 1001 being pre-singulated. Encapsulant structure 160 can be formed between multiple semiconductor modules 1001 between spaced-apart substrates 110. Encapsulant structure 160 can comprise encapsulant top portion 161 on a top portion of main substrate 110, encapsulant bottom portion 162 on a bottom portion of main substrate 110, and encapsulant intermediary portion 163 between spaced-apart portions or modules of main substrate 110. In some examples, encapsulant intermediary portion 163 optionally can be subsequently removed.

In some examples, encapsulant structure 160 can be formed by mounting carrier 10, substrate structure 150, and semiconductor modules 1001, shown in FIG. 4F, in a mold and then inserting a molding material into the mold. In some examples, encapsulant structure 160 comprising encapsulant top portion 161, encapsulant bottom portion 162, and encapsulant intermediary portion 163 can be formed concurrently during a same manufacturing step to enhance the speed, cost, or efficiency of the manufacturing process. In some examples, however, encapsulant top portion 161 and encapsulant bottom portion 162 can be formed, provided, or applied sequentially, one after the other. Encapsulant structure 160 can protect main substrate 110, electronic components 120, 130, or 140 and substrate structure 150 from external environment.

FIG. 4H shows a cross-sectional view of a later stage of manufacture for semiconductor device 100'. In the example shown in FIG. 4H, carrier 10 positioned under substrate structure 150 can be removed or separated from substrate structure 150 and encapsulant bottom portion 162. In some examples, the stage shown at FIG. 4H can be similar to that described above with respect to FIG. 2G. In some examples, carrier 10 can be removed by grinding. In some examples, carrier 10 can be separated from substrate structure 150 and encapsulant bottom portion 162 by heat, a chemical substance, UV light, or a physical force. In some examples, connection pad 155 formed in external interconnect 153 of substrate structure 150 can be exposed. In some examples, when carrier 10 is removed or separated from substrate structure 150 and encapsulant bottom portion 162, connection pad 155 can also be removed or separated from substrate structure 150 and encapsulant bottom portion 162, and external interconnect 153 of substrate structure 150 can be exposed.

FIG. 4I shows a cross-sectional view at a later stage of manufacture of semiconductor device 100'. In the example shown in FIG. 4I, individual semiconductor devices 100' can be provided by singulating along a singulation path through encapsulant structure 160. In some examples, the singulation process can comprise using a waterjet, a saw, a laser, or an etch process through encapsulant structure 160. In the present example, the singulation path can be narrow such that encapsulant intermediary portion 163 remains covering the sidewall of main substrate 110. In some examples, the singulation path can be wider such that encapsulant intermediary portion 163 is removed and the sidewall of main substrate 110 can be exposed similar to that of semiconductor device 100.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
a substrate having a top side, a bottom side, a dielectric structure, and a conductive structure;
a first electronic component on the top side of the substrate;
a second electronic component on the bottom side of the substrate;
an encapsulant structure comprising an encapsulant bottom portion on the bottom side of the substrate and encapsulating the second electronic component;
a conductive pillar in the encapsulant bottom portion, the conductive pillar including a top side oriented toward the substrate, a bottom side oriented away from the substrate, and a linear sidewall located between the top side and the bottom side; and
an internal interconnect coupling the conductive pillar to the conductive structure of the substrate;
wherein the internal interconnect comprises solder and the conductive pillar comprises copper; and
wherein a height of the conductive pillar is less than or equal to a height of the encapsulant bottom portion, and wherein the conductive pillar electrically connects the conductive structure of the substrate to a circuit external to the encapsulant structure.

2. The semiconductor device of claim 1, wherein the encapsulant structure further comprises a top portion on the top side of the substrate and encapsulating the first electronic component.

3. The semiconductor device of claim 1, further comprising a conductor coupled to the bottom side of the conductive pillar.

4. The semiconductor device of claim 3, wherein the conductive pillar comprises a first metal and the conductor comprises a second metal different from the first metal.

5. The semiconductor device of claim 1, further comprising an insulating material surrounding the conductive pillar.

6. The semiconductor device of claim 5, wherein encapsulant bottom portion contacts the insulating material.

7. A semiconductor device, comprising:
a substrate having a first side, a second side, a dielectric structure, and a conductive structure;
a first electronic component on the first side of the substrate;
a second electronic component on the second side of the substrate;
an encapsulant structure comprising a first portion on the first side of the substrate and encapsulating the first electronic component, and a second portion on the second side of the substrate and encapsulating the second electronic component;
a conductive pillar in the second portion of the encapsulant and comprising a linear sidewall, a first side coupled to the conductive structure of the substrate, and a second side opposite to the first side; and
an interconnect material on the second side of the substrate, wherein the first side of the conductive pillar electrically connects to the second side of the substrate via the interconnect material;
wherein the second side of the conductive pillar is exposed at a bottom side of the second portion of the encapsulant structure; and
wherein the interconnect material comprises solder and the conductive pillar comprises copper.

8. The semiconductor device of claim 7, wherein the second side of the conductive pillar is coplanar with the bottom side of the second portion of the encapsulant structure.

9. The semiconductor device of claim 7, further comprising an insulating material surrounding the conductive pillar.

10. The semiconductor device of claim 9, wherein the second portion of the encapsulant structure contacts the insulating material.

11. A method of making semiconductor device, comprising:
coupling a first electronic component to a top side of a substrate, wherein the substrate comprises a conductive structure;
coupling a second electronic component to a bottom side of the substrate;

coupling a conductive pillar to the bottom side of the substrate, wherein the conductive pillar comprises a linear sidewall, a top side oriented toward the substrate and a bottom side oriented away from the substrate;

providing a top encapsulant portion on the top side of the substrate and encapsulating the first electronic component;

providing a bottom encapsulant portion on the bottom side of the substrate and encapsulating the second electronic component and the conductive pillar; and providing an internal interconnect coupling the conductive pillar to the conductive structure of the substrate;

wherein the internal interconnect comprises solder and the conductive pillar comprises copper; and wherein a height of the conductive pillar is less than or equal to a height of the bottom encapsulant portion, and wherein the conductive pillar electrically connects the conductive structure of the substrate to a circuit external to the top encapsulant portion and the bottom encapsulant portion.

12. The method of claim 11, further comprising providing a conductor coupled to the bottom side of the conductive pillar, wherein the conductor is coplanar with a bottom side of the bottom encapsulant portion.

13. The method of claim 12, wherein the conductive pillar comprises a first metal and the conductor comprises a second metal different from the first metal.

* * * * *